United States Patent [19]

Omura et al.

[11] Patent Number: 4,587,627
[45] Date of Patent: May 6, 1986

[54] COMPUTATIONAL METHOD AND APPARATUS FOR FINITE FIELD ARITHMETIC

[75] Inventors: Jimmy K. Omura, Culver City, Calif.; James L. Massey, Zurich, Switzerland

[73] Assignee: OMNET Associates, Sunnyvale, Calif.

[21] Appl. No.: 418,039

[22] Filed: Sep. 14, 1982

[30] Foreign Application Priority Data

Nov. 30, 1981 [EP] European Pat. Off. ........ 81110018.9

[51] Int. Cl.[4] .............................................. G06F 7/52
[52] U.S. Cl. .................................................. 364/754
[58] Field of Search ................ 364/754, 757, 758, 759

[56] References Cited

U.S. PATENT DOCUMENTS

| 3,818,442 | 6/1974 | Solomon | 340/146.1 AL |
| 4,030,067 | 6/1977 | Howell et al. | 340/146.1 AL |
| 4,037,093 | 7/1977 | Gregg et al. | 235/164 |
| 4,162,480 | 7/1979 | Berlekamp | 340/146.1 AL |
| 4,216,531 | 8/1980 | Chiu | 364/757 |
| 4,251,875 | 2/1981 | Marver et al. | 364/754 |

OTHER PUBLICATIONS

Marver: "Sequential Galois Multipliers", Office of Naval Research, PX 12344 Aug. 1977, pp. 1–14.
Marver: "Complexity Reduction in Galois Logic Design", Office of Naval Research PX-12461, Dec. 1977, pp. 1-1-A-2.
Computation with Finite Fields, by Thomas C. Bartee and David I. Schneider, Information and Control 6, pp. 79–98, (1963).
The Synthesis of Nonlinear Feedback Shift Registers, by Kay Brossard Magleby, Oct. 1963, p. 12.

Primary Examiner—James D. Thomas
Assistant Examiner—Dale M. Shaw
Attorney, Agent, or Firm—Kenyon & Kenyon

[57] ABSTRACT

Elements of the finite field $GF(2^m)$ are represented by a vector of m binary digits in such a way that multiplication can be performed by using the same logic function to compute each binary component of the product of two elements, squaring can be performed by logic circuitry that rotates the vector representing the element to be squared, and addition can be performed by logic circuitry that forms the modulo-two sum of the corresponding components of the two vectors representing the elements to be summed.

24 Claims, 9 Drawing Figures

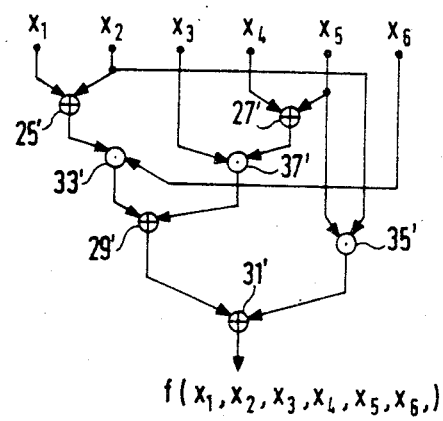
FIG. 5
FIG. 6
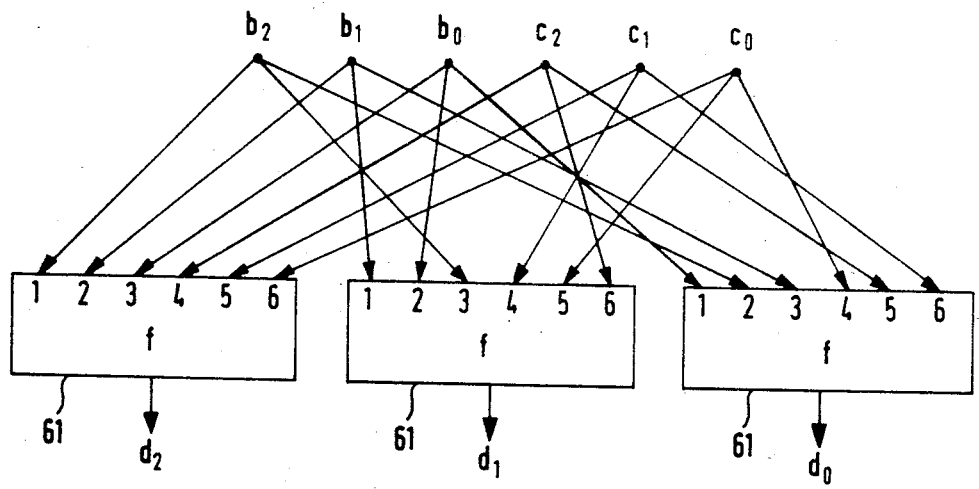

COMPUTATIONAL METHOD AND APPARATUS FOR FINITE FIELD ARITHMETIC

BACKGROUND OF THE INVENTION

The present invention relates to computation in the finite field $GF(2^m)$ in general, and more particularly, to a multiplier for multiplying two elements in the finite field $GF(2^m)$.

The finite field $GF(2^m)$ is a number system containing $2^m$ elements. Its attractiveness in practical applications stems from the fact that each element can be represented by m binary digits. The practical application of error-correcting codes makes considerable use of computation in $GF(2^m)$. Both the encoding and decoding devices for the important Reed-Solomon codes must perform computations in $GF(2^m)$. The decoding device for the binary Bose-Chaudhuri-Hocquenghem codes also must perform computation in $GF(2^m)$. The reader is referred to "Error-Correcting Codes" by W. W. Peterson and E. J. Weldon, Jr., 2nd Ed., the M.I.T. Press, 1972, for details of these and other applications of $GF(2^m)$ computation for error-correction. Recent advances in the art of secrecy coding also require the use of computation in $GF(2^m)$. The reader is referred to the letter "Implementing Public Key Scheme," by S. Berkovits, J. Kowalchuk and B. Schanning, *IEEE Communications Magazine*, Vol. 17, pp. 2–3, May 1979.

The finite field GF(2) is the number system in which the only elements are the binary numbers 0 and 1 and in which the rules of addition and multiplication are the following:

$$0+0=1+1=0$$

$$0+1=1+0=1$$

$$0\times 0 = 1\times 0 = 0\times 1 = 0$$

$$1\times 1 = 1.$$

These rules are commonly called modulo-two arithmetic. The finite field $GF(2^m)$, where m is an integer greater than 1, is the number system in which there are $2^m$ elements and in which the rules of addition and multiplication correspond to arithmetic modulo an irreducible polynomial of degree m with coefficients in GF(2). Although in an abstract sense there is for each m only one field $GF(2^m)$, the complexity of the logic circuitry required to perform operations in $GF(2^m)$ depends strongly on the particular way in which the field elements are represented.

The conventional approach to the design of logic circuitry to perform operations in $GF(2^m)$ is described in such papers as T. Bartee and D. Schneider, "Computation with Finite Fields", *Information and Control*, Vol. 6, pp. 79–98, 1963. In this conventional approach, one first chooses a polynomial P(X) of degree m which is irreducible over GF(2), that is, P(X) has binary coefficients but cannot be factored into a product of polynomials with binary coefficients each of whose degree is less than m. An element A in $GF(2^m)$ is then defined to be a root of P(X), that is, to satisfy P(A)=0. The fact that P(X) is irreducible guarantees that the m elements $A^0=1, A, A^2, \ldots, A^{m-1}$ of $GF(2^m)$ are linearly independent over GF(2), that is, that $b_0+b_1A+b_2A^2+\ldots +b_{m-1}A^{m-1}$ vanishes only when the binary digits $b_0, b_1, b_2 \ldots, b_{m-1}$ are all zeroes. The conventional approach is then to assign the unit vectors of length m with binary components to the elements $1, A, A^2, \ldots, A^{m-1}$.

As a specific example of the conventional approach, consider the finite field $GF(2^3)$ with the choice $$P(X)=X^3+X+1 \tag{2}$$

for the irreducible polynomial of degree 3. The next step is to define A as an element of $GF(2^3)$ such that $$A^3+A+1=0 \tag{3}$$

The following assignment of unit vectors is then made:

$$\begin{aligned} A^0 &= 1 = [0, 0, 1] \\ A &= [0, 1, 0] \\ A^2 &= [1, 0, 0] \end{aligned} \tag{4}$$

An arbitrary element B of $GF(2^3)$ is now represented by the binary vector $[b_2, b_1, b_0]$ with the meaning that $$B=[b_2, b_1, b_0]=b_2A^2+b_1A+b_0 \tag{5}$$

Let $C=[c_2, c_1, c_0]$ be a second element of $GF(2^3)$. It follows from equations (4) and (5) that $$B+C=[b_2+c_2, b_1+c_1, b_0+c_0]. \tag{6}$$

Thus, in the conventional approach, addition in $GF(2^m)$ is easily performed by logic circuitry that merely forms the modulo-two sum of the two vectors representing the elements to be summed component-by-component. Multiplication is, however, considerably more complex to implement. Continuing the example, one sees from equation (3) that $$A^3=A+1$$

$$A^4=A^2+A \tag{7}$$

where use has been made of the fact that $-1=+1$ in GF(2). From the equations (4), (5) and (7) it follows that $$B\times C=[d_2, d_1, d_0] \tag{8}$$

where $$d_0=b_0c_0+b_1c_2+b_2c_1$$

$$d_1=b_0c_1+b_1c_0+b_1c_2+b_2c_1+b_2c_2$$

$$d_2=b_0c_2+b_2c_0+b_1c_1+b_2c_2 \tag{9}$$

Complex logic circuitry is required to implement equations (9). Upon taking C=B in equation (8), it follows from equation (9) that $$B^2=[e_2, e_1, e_0] \tag{10}$$

where $$e_0=b_0$$

$$e_1=b_2$$

$$e_2=b_1+b_2 \tag{11}$$

and where use has been made of the facts that $b^2=b$ and $b+b=0$ in GF(2). Whereas the squaring rule of equations (11) is considerably simpler to implement than the multiplication rule of equations (9), it still has the disadvantage that some additions (in the example, only one) must be performed and that the form of the squaring rule varies among the components of the square.

By way of summary, one can say that the conventional approach to the design of logic circuitry to perform operations in $GF(2^m)$ leads to simple circuitry for addition, somewhat more complex circuitry for squaring, and very complex circuitry for multiplication.

One object of the present invention is to provide a new and improved multiplication method and apparatus for the finite field $GF(2^m)$. Another object is to provide this new and improved multiplication method and apparatus in combination with simple squaring means and addition means to obtain a new and improved method and apparatus for computation in $GF(2^m)$.

SUMMARY OF THE INVENTION

To accomplish these objects, the present invention exploits an unconventional representation of the elements in $GF(2^m)$.

The present invention takes advantage of the following special features of the finite field $GF(2^m)$. There always exists a so-called normal basis for this finite field, that is, one can always find a field element A such that $A, A^2, A^4, \ldots, A^{2^m}$ are a basis for $GF(2^m)$ in the sense that every field element B can be uniquely written as $$B = b_{m-1}A^{2^{m-1}} + \ldots + b_2 A^4 + b_1 A^2 + b_0 A \qquad (12)$$

where $b_0, b_1, b_2, \ldots, b_{m-1}$ are binary digits. Moreover, squaring in $GF(2^m)$ is a linear operation in the sense that for every pair of elements B and C in $GF(2^m)$ $$(B+C)^2 = B^2 + C^2 \qquad (13)$$

Further, it is the case for every element B of $GF(2^m)$ that $$B^{2^m} = B. \qquad (14)$$

Finally, if B is a root of any polynomial P(X) of degree m and irreducible over GF(2), then $B, B^2, B^4, \ldots B^{2^{m-1}}$ are all in $GF(2^m)$ and are the complete set of roots of P(X). Proofs of these facts about $GF(2^m)$ may be found in standard textbooks on algebra as well as in "The Theory of Error-Correcting Codes" by F. J. MacWilliams and N. J. A. Sloane, North-Holland Publishing Company, 1977.

The invention lies in the recognition that when the finite field $GF(2^m)$ is represented by assigning the unit vectors of length m with binary components to the elements $A, A^2, A^4, \ldots, A^{2^{m-1}}$ in a normal basis then both multiplication and squaring can be implemented with much simpler logic circuitry than for the conventional approach described above, while addition remains equally simple to implement.

According to the invention, the design of logic circuitry to perform operations in $GF(2^m)$ begins by choosing a polynomial P(X) of degree m which is irreducible over GF(2) and which has linearly independent roots. This latter condition on P(X) insures that upon defining A as an element of $GF(2^m)$ such that $P(A)=0$ then $A, A^2, A^4, \ldots A^{2^{m-1}}$ form a normal basis for $GF(2^m)$.

Further, according to the invention, an arbitrary element of $GF(2^m)$ is represented by the binary vector $[b_{m-1}, \ldots, b_2, b_1, b_0]$ with the meaning that equation (12) is satisfied.

It follows from (12) that $B=[b_{m-1}, \ldots, b_2, b_1, b_0]$ and $C=[c_{m-1}, c_{m-2}, \ldots, c_0]$ in said normal basis representation implies $$B+C = [b_{m-1}+c_{m-1}, \ldots, b_2+c_2, b_1+c_1, b_0+c_0]. \qquad (15)$$

Thus, addition in $GF(2^m)$ can be performed by logic circuitry that merely performs the modulo-two sum component-by-component of the two vectors representing the elements to be summed in said normal basis representation, exactly as is the case for the conventional representation described above.

It was shown in the report by K. B. Magleby, "The Synthesis of Nonlinear Feedback Shift Registers", *Technical Report* No. 6207-1, Stanford Electonics Laboratories, Stanford University, Stanford, CA, October 1963, that for said normal basis representation of $GF(2^m)$ then $B=[b_{m-1}, \ldots, b_2, b_1, b_0]$ implies $$B^2 = [b_{m-2}, \ldots, b_1, b_0, b_{m-1}]. \qquad (16)$$

Thus, squaring can be implemented by logic circuitry that merely rotates by one position the components of the vector representing the element to be squared. This results in much simpler squaring circuitry than is required when the conventional representation of $GF(2^m)$ described above is used. Equation (16) is a direct consequence of equations (12), (13) and (14).

According to the invention, it has been realized that the use of said normal basis representation greatly simplifies the logic circuitry required to implement multiplication in $GF(2^m)$. If $B=[b_{m-1}, \ldots, b_2, b_1, b_0]$ and $C=[c_{m-1}, \ldots, c_2, c_1, c_0]$ are any two elements of $GF(2^m)$ in said normal basis representation, then the product $$D = B \times C = [d_{m-1}, \ldots, d_2, d_1, d_0] \qquad (17)$$

has the property that the same logic circuitry which when applied to the components of the vectors representing B and C produces $d_{m-1}$ will sequentially produce the remaining components $d_{m-2}, \ldots, d_2, d_1, d_0$ of the product when applied to the components of the successive rotations of the vectors representing B and C. This feature permits, according to the invention, the use of one simple logic circuit that sequentially calculates the m components of the product. Alternatively, according to the invention, this feature permits the use of m identical simple logic elements to calculate simultaneously all m components of the product. This feature is a direct consequence of equation (16) and the fact that $D=B \times C$ implies $D^2 = B^2 \times C^2$.

BRIEF DESCRIPTION OF THE DRAWINGS

FIG. 5 is a logic diagram of a device that computes the logic function $f(x_1, x_2, x_3, x_4, x_5, x_6) = x_2x_5 + x_3x_5 + x_2x_6 + x_3x_4 + x_1x_6$ of six binary variables.

FIG. 6 is a block diagram of a multiplier for $GF(2^3)$ that simultaneously computes all three binary components of the product.

DETAILED DESCRIPTION

Although the superiority of the invention over conventional means for performing operations in $GF(2^m)$ increases with m, the invention will be explained for the small fields $GF(2^3)$ and $GF(2^7)$ for ease in understanding.

The design of the logic circuitry for $GF(2^3)$ begins with the selection of $$P(X) = X^3 + X^2 + 1 \tag{18}$$

as a polynomial of degree $m=3$ which is irreducible in $GF(2)$ and which has linearly independent roots. (Notice that the polynomial $X^3 + X + 1$ used above to illustrate the conventional appproach to implement logic for $GF(2^3)$, although irreducible over $GF(2)$, does not have linearly independent roots as shown by the second equation in equations (7); thus, this polynomial cannot be used in connection with the techniques of this invention). The next step is to define A to be a root of P(X), that is, to specify that $$A^3 + A^2 + 1 = 0. \tag{19}$$

The following assignment of unit vectors with binary components to the normal basis is now made.

$$A = [0, 0, 1]$$

$$A^2 = [0, 0, 1]$$

$$A^4 = [1, 0, 0]. \tag{20}$$

An arbitrary element B of $GF(2^3)$ is now represented by the vector $[b_2, b_1, b_0]$ with the meaning that $$B = b_2 A^4 + b_1 A^2 + b_0 A. \tag{21}$$

Letting $C = [c_2, c_1, c_0]$ be an arbitrary second element of $GF(2^3)$, one can write the addition rule as $$B + C = [b_2 + c_2, b_1 + c_1, b_0 + c_0]. \tag{22}$$

Thus, addition in $GF(2^3)$ for this normal basis representation can be performed by three modulo-two adders, each of which operates on a pair of corresponding components of the vectors representing the elements B and C. Alternatively, addition can be performed as shown in FIG. 1 by using a single modulo-two adder that operates on successive rotations of the vectors B and C to produce the successive components of the sum.

Figure 1:
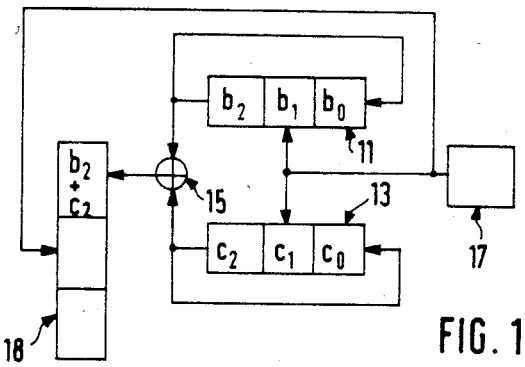
FIG. 1 is a block-logic diagram for a device that performs both addition and squaring in $GF(2^3)$.

The addition means of FIG. 1 consists of two three-stage circulating shift-registers 11 and 13 that are initially loaded as shown with the components of B and C, respectively. The content of the leftmost stage of each shift-register is an input to the modulo-two adder 15 whose initial output digit is the first component $b_2 + c_2$ of the sum B+C. A clock 17 causes the contents of the shift registers 11 and 13 to shift one position leftward for each clock cycle, thus causing the second and third output digits of the adder 15 to be the second and third components, respectively, of the sum B+C. The respective components of the sum are collected in shift register 18, shown after one clock cycle of the logic.

Upon squaring equation (21), making use of the facts that $b^2 = b$ in $GF(2)$, that squaring is a linear operation in $GF(2^3)$, and that $A^8 = A$ in $GF(2^3)$, one obtains $$B^2 = b_1 A^4 + b_0 A^2 + b_2 A \tag{23}$$

or, equivalently, $$B^2 = [b_1, b_0, b_2]. \tag{24}$$

Thus, squaring in $GF(2^3)$ for this normal basis representation can be performed by a three-stage circulating shift-register that causes a left rotation of its contents. In particular, the shift-register 11 of FIG. 1 which is initially loaded with the components of B will during the second clock cycle contain the components of $B^2$ and will during the third clock cycle contain the components of $B^4$ reading from left to right. $C^2$ and $C^4$ are similarly the contents of shift-register 13 during the second and third clock cycles. This example illustrates one feature of the invention, namely that the same logic circuitry can simultaneously be performed adding operations and squaring operations in $GF(2^m)$.

Because $1^2 = 1$ and because squaring with a normal basis representation corresponding to a rotation of the vector representing an element of $GF(2^m)$, it follows that the element 1 of $GF(2^m)$ must always be represented by the all-ones vector or, equivalently, that $$1 = A + A^2 + A^4 + \ldots A^{2m-1} \tag{25}$$

when $A, A^2, A^4, \ldots, A^{2m-1}$ is a normal basis for $GF(2^m)$. For the example of $GF(2^3)$, equation (25) becomes $$1 = A + A^2 + A^4. \tag{26}$$

The following equations follow immediately from equations (19) and (26):

$$A^3 = A^4 + A = [1, 0, 1]$$

$$A^5 = A^4 + A^2 = [1, 1, 0]$$

$$A^6 = A^2 + A = [0, 1, 1]. \tag{27}$$

Carrying out the product of $B = b_2 A^4 + b_1 A^2 + b_0 A$ and $C = c_2 A^4 + c_1 A^2 + c_0 A$, then making use of equation (27) and the fact that $A^8 = A$, one obtains $$B \times C = [d_2, d_1, d_0] \tag{28}$$

where $$d_2 = b_1c_1 + b_0c_1 + b_1c_0 + b_0c_2 + b_2c_0$$

$$d_1 = b_0c_0 + b_2c_0 + b_0c_2 + b_2c_1 + b_1c_2$$

$$d_0 = b_2c_2 + b_1c_2 + b_2c_1 + b_1c_0 + b_0c_1. \quad (29)$$

Although equations (29) appear superficially more complex than equations (9) obtained from the conventional representation of $GF(2^3)$, the advantage of equations (29) for logic implementation can be seen from the fact that the subscripts in the successive equations of (29) are those of the previous equation reduced by one (except that 0 is "reduced" to 2 in accordance with the principle of rotation). Thus, the same logic function applied to different rotations of the vectors representing B and C produces all three components of the product $B \times C$.

Equations 29 can be rewritten as:

$$d_2 = (b_0(c_1+c_2) + c_0(b_1+b_2)) + b_1c_1$$

$$d_1 = (b_2(c_0+c_1) + c_2(b_0+b_1)) + b_0c_0$$

$$d_0 = (b_1(c_2+c_0) + c_1(b_2+b_0)) + b_2c_2 \quad (29a)$$

Figure 2A:
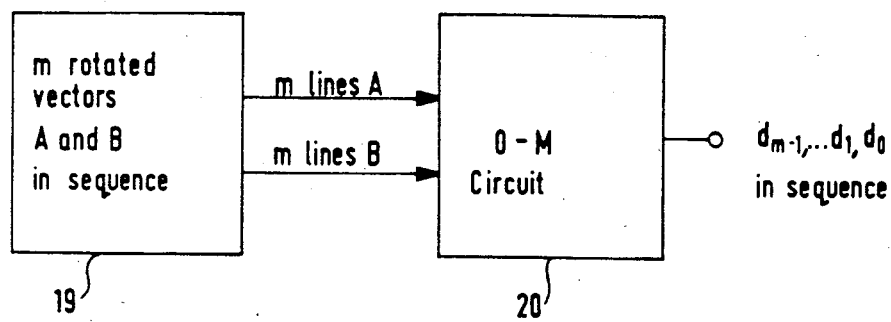
FIG. 2A illustrates the basic system concept for a multiplier that sequentially computes each binary component of the product.
Figure 2B:
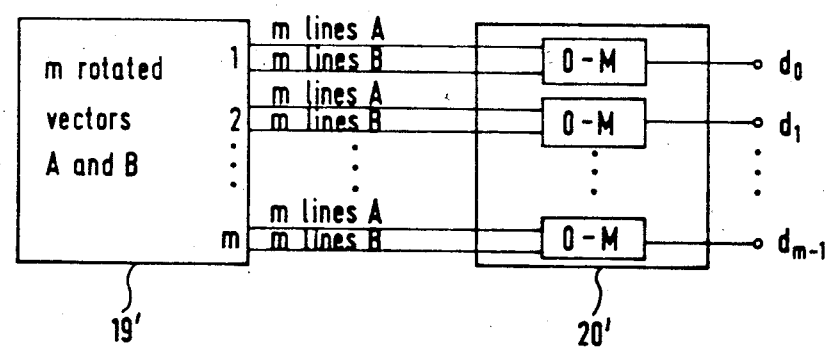
FIG. 2B illustrates the basic system concept for a multiplier that simultaneously computes each binary component of the product.

FIGS. 2A and 2B illustrate the basic system for multiplying in $GF(2^m)$. The system comprises two basic components: a means 19 in FIG. 2A, 19' in FIG. 2B, for obtaining m rotated vectors for each element in the field to be multiplied, and a logic means 20 in FIG. 2A, 20' in FIG. 2B, for obtaining each component of the product vector. FIG. 2A illustrates a sequential multiplier, in that each of two respective rotated vectors are applied to the same logic circuit to compute the m components of the product in sequence. This logic circuit, hereinafter denoted the O-M circuit, may be found for any m using the above normal basis representation of the two elements to be multiplied.

FIG. 2B illustrates a simultaneous multiplier, because all m components of the product are obtained simultaneously by coupling all m rotations of each vector to be multiplied to m identical O-M circuits.

Figure 3:
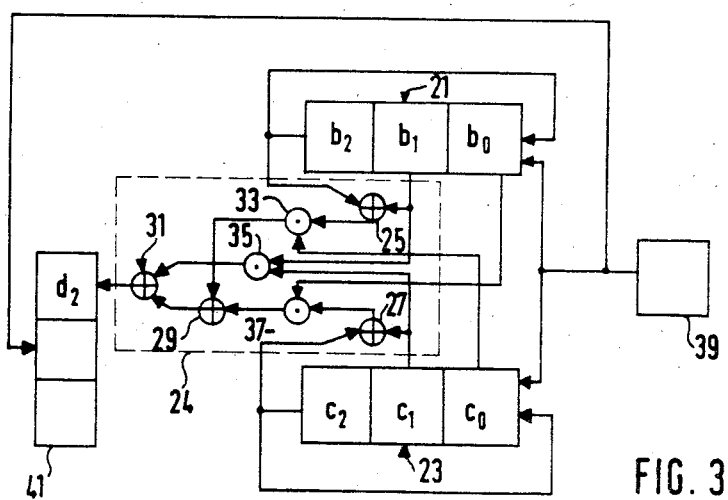
FIG. 3 is a block-logic diagram of a multiplier for $GF(2^3)$ that sequentially computes each binary component of the product.

FIG. 3 is a block-logic diagram of a sequential multiplier for $GF(2^3)$ for the above normal basis representation. The multiplier consists of three-stage circulating shift-registers 21 and 23 and associated clocks 39, and an O-M circuit 24 made up of modulo-two adders 25, 27, 29 and 31, and AND gates 33, 35 and 37 implementing the logic functions of equations (29a). (Modulo-two multiplication as given in equation (1) is identical to the logical AND operation.) The illustrated combination of modulo-two adders and AND gates constitutes the O-M circuit 24 for $GF(2^3)$. Shift-registers 21 and 23 are initially loaded as shown with the components of B and C in the normal basis representation. The modulo-two adders and AND gates are so arranged that the initial output digit from adder 31 is $d_2$ as expressed symbolically by $$d_2 = (b_0(c_1+c_2) + c_0(b_1+b_2)) + b_1c_1. \quad (30)$$

The operation of O-M circuit 24 can be explained as follows. In the initial clock cycle of clock 39, the inputs to modulo-two adder 27 are two components of vector C, $c_1$ and $c_2$. The output of adder 27 is fed to an input of AND gate 37, along with component $b_0$. AND gate 37 performs the modulo-two multiplication $s = b_0(c_1+c_2)$. Modulo-two adder 25 similarly computes the modulo-two sum $b_1+b_2$. AND gate 33 computes the modulo two product $t = c_0(b_1+b_2)$. Products s and t are the inputs to modulo two adder 29, which calculates the modulo-two sum $u = b_0(c_1+c_2) + c_0(b_1+b_2)$. The modulo-two product $b_1c_1$ is computed by AND gate 35, and the output is fed to modulo two adder 31 to be summed with u, with the result given by equation 30. The remaining components, $d_1$ and $d_0$ are obtained in like fashion in successive clock cycles of the logic. In each successive clock cycle, the contents of shift-registers 21 and 23 are rotated one position leftward causing the second and third output digits from adder 31 to be $d_1$ and $d_0$, respectively, in accordance with the second and third of equations (29a). Shift register 41, shown after one clock cycle, collects the respective components of the product.

Figure 4:
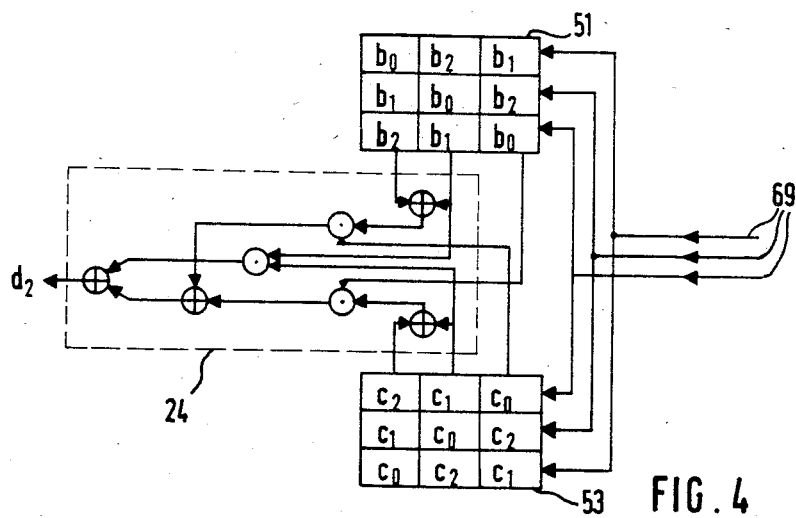
FIG. 4 is an alternative block-logic diagram of a multiplier for $GF(2^3)$ that sequentially computes each binary component of the product.

FIG. 4 illustrates an alternative embodiment of the sequential multiplier. In FIG. 4, memories 51 and 53 contain the three rotations of the vectors representing the elements B and C to be multiplied. Address lines 69 select, in sequence, the respective rotated vectors, which appear at the memory output lines and are fed to the O-M circuit 24 corresponding to that in FIG. 3, which computes each component of the product.

The first of equations (29) specifies $d_2$ as a logic function of six binary variables. One skilled in the art of logic design will recognize many other ways to realize this function besides the method used in the multiplier of FIGS. 3 and 4 requiring four modulo-two adders and three AND gates, and all of these further ways are considered to be within the scope of this invention.

Let $x_1, x_2, x_3, x_4, x_5$ and $x_6$ be binary variables and consider the logical function f defined by $$f(x_1, x_2, x_3, x_4, x_5, x_6) = x_2x_5 + x_3x_5 + x_2x_6 + x_3x_4 + x_1x_6 \quad (31)$$

where the addition is modulo-two addition. The first of equations (29) can be written as $$d_2 = f(b_2, b_1, b_0, c_2, c_1, c_0) \quad (32)$$

which makes clear that the modulo-two adders and AND gates in FIG. 3 compute the function f. This is further made clear by FIG. 5 which shows the logic circuitry for the computation of the function f as expressed symbolically by $$f(x_1, x_2, x_3, x_4, x_5, x_6) = (x_3(x_5+x_4) + x_6(x_2+x_1)) + x_2x_5. \quad (33)$$

Adders 25', 27', 29' and 31' and AND gates 33', 35' and 37' in FIG. 5 correspond, respectively, to adders 25, 27, 29 and 31 and AND gates 33, 35 and 37 in FIG. 3.

Comparison of equations (31) and the second and third equations of (29) reveals that these latter equations may be written as $$d_1 = f(b_1, b_0, b_2, c_1, c_0, c_2)$$

$$d_0 = f(b_0, b_2, b_1, c_0, c_2, c_1) \quad (34)$$

FIG. 6 illustrates the block diagram of a multiplier for $GF(2^3)$ which simultaneously computes all the components of the product. Logic blocks 61 are each replications of the logic circuit of FIG. 5, the O-M circuit for $GF(2^3)$. The inputs to the three O-M circuits are arranged so that the components of both vectors representing the element to be multiplied appear at each successive O-M circuit rotated by one position in accordance with equations (32) and (34). In this manner, each O-M circuit computes one of the three components of the product simultaneously. This method of implementing multiplication is particularly attractive when integrated circuit technology is employed to realize the logic circuitry.

The invention will now be explained for $GF(2^7)$. The design of the logic circuitry for $GF(2^7)$ begins with the selection of $$P(X) = X^7 \times X^6 + 1 \qquad (35)$$

as a polynomial of degree $m=7$ which is irreducible in $GF(2)$ and which has linearly independent roots. The next step is to define $A$ to be a root of $P(X)$, that is, to specify that $$A^7 + A^6 + 1 = 0. \qquad (36)$$

The following assignment of unit vectors with binary components to the normal basis is now made.

$$A = [0, 0, 0, 0, 0, 0, 1]$$
$$A^2 = [0, 0, 0, 0, 0, 1, 0]$$
$$A^4 = [0, 0, 0, 0, 1, 0, 0]$$
$$A^8 = [0, 0, 0, 1, 0, 0, 0] \qquad (37)$$
$$A^{16} = [0, 0, 1, 0, 0, 0, 0]$$
$$A^{32} = [0, 1, 0, 0, 0, 0, 0]$$
$$A^{64} = [1, 0, 0, 0, 0, 0, 0]$$

An arbitrary element $B$ of $GF(2^7)$ is now represented by the vector $[b_6, b_5, b_4, b_3, b_2, b_1, b_0]$ with the meaning that $$B = b_6 A^{64} + b_5 A^{32} + b_4 A^{16} + b_3 A^8 + b_2 A^4 + b_1 A^2 + b_0 A \qquad (38)$$

Letting $C = [c_6, c_5, c_4, c_3, c_2, c_1, c_0]$ be an arbitrary second element of $GF(2^7)$, one can write the addition rule $$B + C = [b_6 + c_6, b_5 + c_5, b_4 + c_4, b_3 + c_3, b_2 + c_2, b_1 + c_1, b_0 + c_0] \qquad (39)$$

Figure 7:
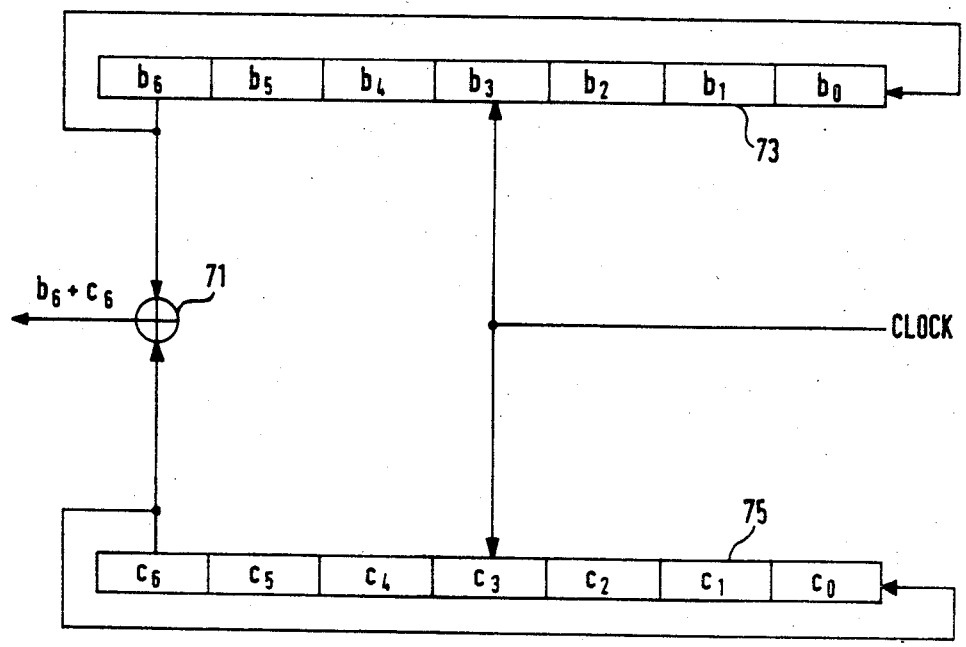
FIG. 7 is a block-logic diagram for a device that performs both addition and squaring in $GF(2^7)$.

FIG. 7 shows how this addition can be performed by using a single modulo-two adder 71 that operates on successive rotations of the vectors $B$ and $C$ to produce the successive components of the sum. Two seven stage circulating shift registers 73 and 75 provide the seven successive rotations of the vectors $B$ and $C$.

Upon squaring equation (38), making use of the facts that $b^2 = b$ in $GF(2)$, that squaring is a linear operation in $GF(2^7)$, and that $A^{128} = A$ in $GF(2^7)$, one obtains $$B^2 = b_5 A^{64} + b_4 A^{32} + b_3 A^{16} + b_2 A^8 + b_1 A^4 + b_0 A^2 + b_6 A \qquad (40)$$

or, equivalently, $$B^2 = [b_5, b_4, b_3, b_2, b_1, b_0, b_6] \qquad (41)$$

Thus, squaring in $GF(2^7)$ for this normal basis representation can be performed by a seven-stage circulating shift-register that causes a left rotation of its contents. FIG. 7 illustrates the feature that the same logic circuitry can simultaneously be performing addition operations and squaring operations in $GF(2^7)$.

Because $1^2 = 1$ and because squaring with a normal basis representation corresponds to a rotation of the vector representing an element of $GF(2^7)$, it follows that the element $1$ of $GF(2^7)$ must always be represented by the all-ones vector or equivalently, that $$1 = A + A^2 + A^4 + A^8 + A^{16} + A^{32} + A^{64} \qquad (42)$$

From equations (36) and (42) the binary vector representation can be found for all 128 elements of $GF(2^7)$. The product of $B = b_6 A^{64} + b_5 A^{32} + b_4 A^{16} + b_3 A^8 + b_2 A^4 + b_1 A^2 + b_0 A$ and $C = c_6 A^{64} + c_5 A^{32} + c_4 A^{16} + c_3 A^8 + c_2 A^4 + c_1 A^2 + c_0 A$ can then be carried out to obtain $$B \times C = [d_6, d_5, d_4, d_3, d_2, d_1, d_0] \qquad (43)$$

The seven rotated components $d_i$ for $i=0$ to $6$ can be shown to be determined by the equation:

$$d_i = b_i(c_{i-1} + c_{i-3} + c_{i-6}) + c_i(b_{i-1} + b_{i-3} + b_{i-6})$$
$$+ b_{i-3}(c_{i-1} + c_{i-2} + c_{i-4}) + c_{i-3}(b_{i-1} + b_{i-2} + b_{i-4})$$
$$+ b_{i-4}(c_{i-2} + c_{i-5} + c_{i-6}) + c_{i-4}(b_{i-2} + b_{i-5} + b_{i-6})$$
$$+ b_{i-1}c_{i-5} + b_{i-5}c_{-1} + b_{i-1}c_{i-1} \qquad (44)$$

where any negative subscripts are understood to be taken modulo 7; that is, a subscript formally equal to $-1$ is understood to mean a 6, a subscript formally equal to $-2$ is understood to mean a 5, etc. For instance, taking $i=3$ in (44) gives $$d_3 = b_3(c_2 + c_0 + c_4) + c_3(b_2 + b_0 + b_4)$$
$$+ b_0(c_2 + c_1 + c_6) + c_0(b_2 + b_1 + b_6)$$
$$+ b_6(c_1 + c_5 + c_4) + c_6(b_1 + b_5 + b_4)$$
$$+ b_2 c_5 + b_5 c_2 + b_2 c_2 \qquad (45)$$

For $i=6$, equation 44 becomes:

$$d_6 = b_6(c_5 + c_3 + c_0) + c_6(b_5 + b_3 + b_0)$$
$$+ b_3(c_5 + c_4 + c_2) + c_3(b_5 + b_4 + b_2)$$
$$+ b_2(c_4 + c_1 + c_0) + c_2(b_4 + b_1 + b_0)$$
$$+ b_5 c_1 + b_1 c_5 + b_5 c_5 \qquad (46)$$

Figure 8:
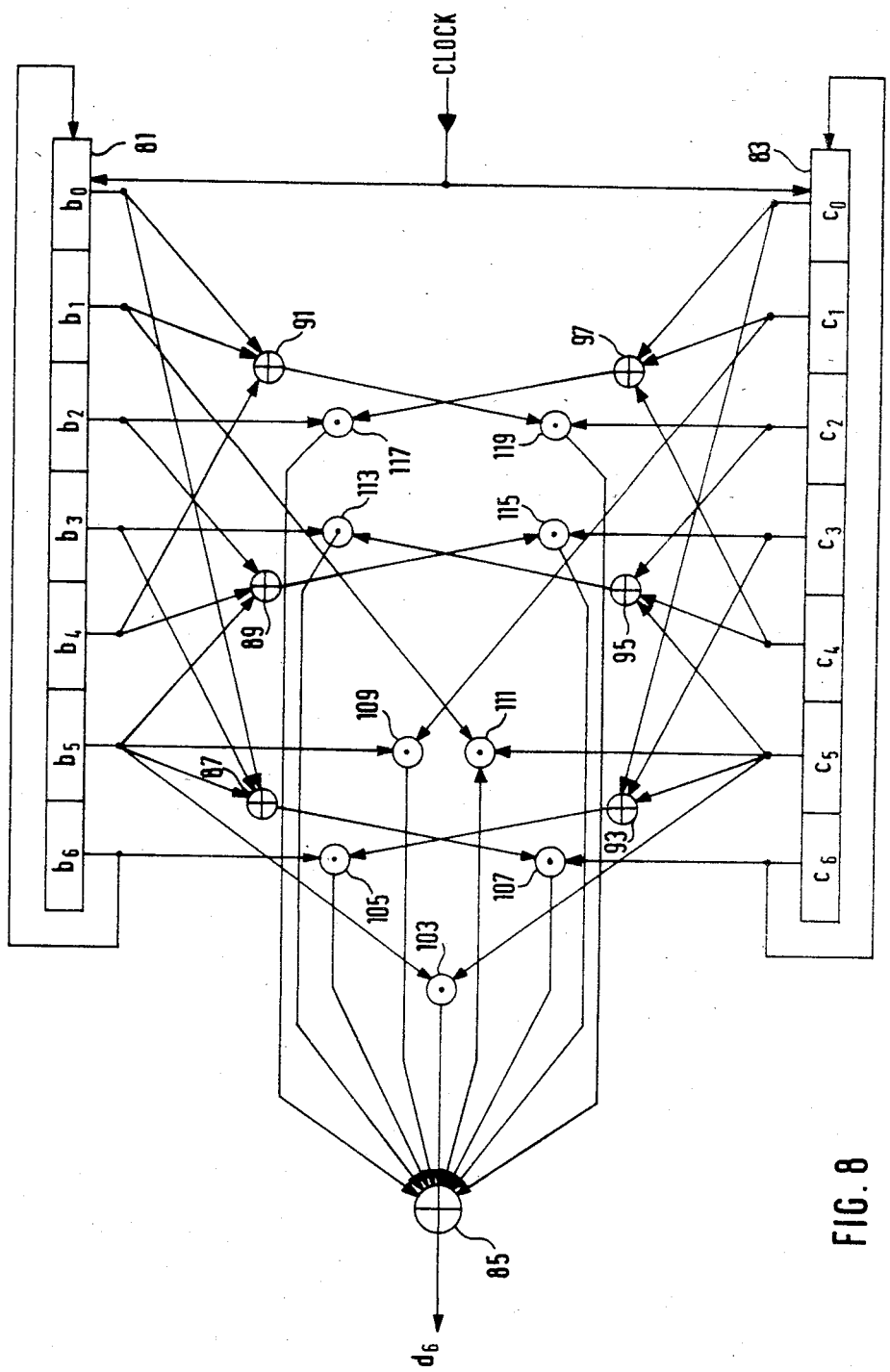
FIG. 8 is a block-logic diagram of a multiplier for $GF(2^7)$ that sequentially computes each binary component of the product.

FIG. 8 illustrates the block-logic diagram of a multiplier for $GF(2^7)$ for the above normal basis representation. It utilizes an O-M circuit consisting of seven modulo two adders, 85, 87, 89, 91, 93, 95 and 97, and nine AND gates, 103, 105, 107, 109, 111, 113, 115, 117 and 119 and two seven stage circulating shift registers 81 and 83. In the first clock cycle of the logic, the output will be $d_6$, as given by equation (46). In each successive clock cycle of the logic, the contents of shift-registers 81 and 83 are rotated one position leftward causing the second, third, fourth, fifth, sixth and seventh outputs from adder 85 to be $d_5$, $d_4$, $d_3$, $d_2$, $d_1$, and $d_0$, respectively. The multiplier for $GF(2^7)$ may also be implemented using 7 identical O-M circuits which simultaneously compute the components $d_6$, $d_5$, $d_4$, $d_3$, $d_2$, $d_1$ and $d_0$, in like manner as the circuit of FIG. 6.

Equation (44) specifies $d_i$ as a logical function of fourteen binary variables. One skilled in the art of logic design will recognize many other ways to realize this function besides the method used in the multiplier of FIG. 8 requiring seven modulo-two adders and nine AND gates, and all of these further ways are considered to be within the scope of this invention.

Finally it will be noted that it is not intended that the examples and discussion should be taken to limit the applicability of the invention. Various modifications within the spirit and scope of the invention will occur to those skilled in the art of digital logic design.

What is claimed is:

1. A multiplier for performing multiplication of two elements in the finite Galois field $GF(2^m)$ having $2^m$ elements, and obtaining a product vector of m binary components, where m is an integer equal to or greater than 2, each of said $2^m$ elements of $GF(2^m)$ represented by a vector of m binary components, comprising:
   (a) means for developing, for each of the two vectors, m successive rotated vectors, each of said vectors being represented according to a normal basis representation of the form $B = b_{m-1}A^{2m-1} + b_{m-2}A^{2m-2} + \ldots b_2 A^4 + b_1 A^2 + b_0 A$, where B is an element of $GF(2^m)$ and $b_{m-1}, b_{m-2}, \ldots b_2, b_1, b_0$ are the binary components of B, and A is an element of $GF(2^m)$, where A satisfies the equation $P(X) = 0$ for $X = A$ and $P(X)$ is a polynomial of degree m which is irreducible over the field $GF(2)$ and has linearly independent roots; and
   (b) logic means for implementating a predetermined logical function having the m rotated vectors for both elements as inputs, said logic means computing each binary component of the vector representing the product of said two elements from respective pairs of said vectors using said predetermined logical function.

2. The multiplier recited in claim 1 wherein:
   (a) said means for developing m rotated vectors comprise means to sequentially rotate the components of each vector representing an element to be multiplied in one position increments; and
   (b) said logic means comprise circuit means having as inputs the outputs of said means for developing whereby m rotated vectors will be supplied in sequence for each element to said logic means, and said logic means will thereby compute each binary component of said product vector.

3. The multiplier recited in claim 1 wherein:
   (a) said logic means comprise m identical circuit means for computing the respective binary components of said vector representing the product of said two elements; and
   (b) said means for developing m rotated vectors comprise a plurality of connections to said m identical circuit means such that the binary components of said vectors are coupled as m rotated vectors at the inputs to respective one of said m identical circuit means successively shifted by one position at each successive identical logic circuit means.

4. The multiplier recited in claim 1, 2 or 3 wherein each of the $2^m$ elements of $GF(2^m)$ is represented by a vector of m binary components according to a normal basis representation of the form $B = b_{m-1}A^{2m-1} + b_{m-2}A^{2m-2} + \ldots b_2 A^4 + b_1 A^2 + b_0 A$, where B is an element of $GF(2^m)$, $b_{m-1}, b_{m-2}, \ldots b_2, b_1, b_0$ are the binary components of B, and A is an element of $GF(2^m)$ satisfying the equation $P(X) = 0$ for $X = A$, where $P(X)$ is a polynomial of degree m which is irreducible over the field $GF(2)$ and has linearly independent roots.

5. A multiplier for performing multiplication of two elements in the finite Galois field $GF(2^m)$ having $2^m$ elements, and obtaining a product vector of m binary components, where m is an integer equal to or greater than 2, each of said $2^m$ elements of $GF(2^m)$ represented by a vector of m binary components, comprising:
   (a) means for storing said vectors representing said two elements of $GF(2^m)$ to be multiplied having m outputs for each element, each of said vectors being represented according to a normal basis representation of the form $B = b_{m-1}A^{2m-1} + b_{m-2}A^{2m-2} + \ldots b_2 A^4 + b_1 A^2 + b_0 A$, where B is an element of $GF(2^m)$ and $b_{m-1}, b_{m-2}, \ldots b_2, b_1, b_0$ are the binary components of B, and A is an element of $GF(2^m)$, where A satisfies the equation $P(X) = 0$ for $X = A$ and $P(X)$ is a polynomial of degree m which is irreducible over the field $GF(2)$ and has linearly independent roots;
   (b) logic means implementing a predetermined logical function for computing each component of the product vector of said two elements of $GF(2^m)$ to be multiplied, such that each component of said product vector is computed using said predetermined logical function; and
   (c) means for obtaining from said means for storing and providing as inputs to said logic means, said stored vectors rotated so as to provide m rotated vectors, each shifted with respect to an adjacent rotated vector by one position.

6. The multiplier recited in claim 5 wherein:
   (a) said means for storing said vectors representing said two elements to be multiplied comprise two m-bit circulating shift registers, each containing the m components of a vector representing an element to be multiplied;
   (b) said logic means for computing each component of the product vector of said two elements to be multiplied comprise logic circuit means having as inputs the outputs of said two shift registers; and
   (c) said means for obtaining comprises clocking circuitry for repetitively shifting the binary components of the vectors representing each of said two elements to be multiplied in said two m-bit circulating shift registers whereby after m shifts, the m components of said product will have been determined by said logic means.

7. The multiplier recited in claim 5 wherein said means for storing said vectors representing said two elements to be multiplied comprises memory means having stored therein m rotations of each vector representing said two elements to be multiplied and said means for obtaining comprises means for accessing the storage locations of said m rotations.

8. The multiplier recited in claim 5 wherein:
   (a) said logic means comprise m identical logic circuit means for computing the respective binary components of said product vector; and
   (b) said means for obtaining comprise means coupling the outputs of said means for storing to each of said m identical circuit means such that said components of said vectors representing said elements to be multiplied appear at the inputs to successive ones of said m identical circuit means successively shifted by one position such that each component replaces the next higher component and the high order component replaces the low order component at the inputs to each successive identical circuit means.

9. The multiplier recited in any of claims 5, 6, 7 or 8 wherein each of the $2^m$ elements of $GF(2^m)$ is represented by a vector of m binary components according to a normal basis representation of the form $B = b_{m-1}A^{2m-1} + b_{m-2}A^{2m-2} + \ldots b_2A^4 + b_1A^2 + b_0A$, where B is an element of $GF(2^m)$, $b_{m-1}, b_{m-2}, \ldots b_2, b_1, b_0$ are the binary components of B, and A is an element of $GF(2^m)$ satisfying the equation $P(X) = 0$ for $X = A$, where $P(X)$ is a polynomial of degree m which is irreducible over the field $GF(2)$ and has linearly independent roots.

10. A method for multiplying two elements in the finite Galois field $GF(2^m)$ having $2^m$ elements to obtain a product vector of m binary components, where m is an integer equal to or greater than 2, each of said $2^m$ elements of $GF(2^m)$ represented by a vector of m binary components, the method comprising the steps of:
  (a) obtaining from each of said vectors representing an element of $GF(2^m)$ to be multiplied m rotated vectors in which there is a shift of one position in successive vectors, thereby obtaining m pairs of rotated vectors, each of said vectors being represented according to a normal basis representation of the form $B = b_{m-1}A^{2m-1} + b_{m-2}A^{2m-2} + \ldots b_2A^4 + b_1A^2 + b_0A$, where B is an element of $GF(2^m)$ and $b_{m-1}, b_{m-2}, \ldots b_2, b_1, b_0$ are the binary components of B, and A is an element of $GF(2^m)$, where A satisfies the equation $P(X) = 0$ for $X = A$ and $P(X)$ is a polynomial of degree m which is irreducible over the field $GF(2)$ and has linearly independent roots; and
  (b) supplying each of the pairs of vectors to logic means for implementing a predetermined logical function to obtain the m binary components of said product vector, each component being computed by said predetermined logical function.

11. The method recited in claim 10 wherein said step of supplying comprises sequentially supplying said pairs of vectors to said logic means to compute sequentially the binary components of said vector representing the product of said two elements.

12. The method recited in claim 11 wherein said step of obtaining comprises:
  (a) storing said vectors representing said elements in recirculating shifting storage means;
  (b) coupling the outputs of said storage means to said logic means; and
  (c) shifting the binary components of said vectors repetitively by one position such that each component replaces the next higher component and the high order component replaces the low order component, and such that successive components of the product vector of said two elements may be calculated.

13. The method recited in claim 11 wherein said step of obtaining comprises:
  (a) storing representations of said m rotated vectors in storage means; and
  (b) sequentially coupling said stored representations to said logic means.

14. The method recited in claim 10 wherein said step of supplying comprises supplying said pairs of vectors to m identical logic circuit means whereby each of said logic circuit means will simultaneously compute one of said binary components of said product vector.

15. The method recited in claim 14 wherein said step of obtaining comprises:
  (a) storing said two vectors in storage means, said storage means having m outputs corresponding to each of said vectors; and
  (b) coupling the outputs of said storage means to said m identical logic circuit means such that said components of said vectors representing said elements to be multiplied appear at the inputs to each of said m identical logic circuit means but said m components of each of said vectors are successively shifted by one position such that each component replaces the low order component at the inputs to each successive identical logic circuit means.

16. The method recited in any of claims 10 to 15 wherein each of the $2^m$ elements of $GF(2^m)$ is represented by a vector of m binary components according to a normal basis representation of the form $B = b_{m-1}A^{2m-1} + b_{m-2}A^{2m-2} + \ldots b_2A^4 + b_1A^2 + b_0A$, where B is a element of $GF(2^m)$, $b_{m-1}, b_{m-2}, \ldots b_2, b_1, b_0$ are the binary components of B, and A is an element of $GF(2^m)$ satisfying the equation $P(X) = 0$ for $X = A$, where $P(X)$ is a polynomial of degree m which is irreducible over the field $GF(2)$ and has linearly independent roots.

17. A method for multiplying two elements in the finite Galois field $GF(2^m)$ having $2^m$ elements to obtain a product vector of m binary components, where m is an integer equal to or greater than 2, each of said $2^m$ elements of $GF(2^m)$ represented by a vector of m binary components, the method comprising the steps of:
  (a) storing said two elements to be multiplied in recirculating shifting storage means, each of said elements being represented by a vector of m binary components according to a normal basis representation of the form $B = b_{m-1}A^{2m-1} + b_{m-2}A^{2m-2} + \ldots b_2A^4 + b_1A^2 + b_0A$, where B is an element of $GF(2^m)$ and $b_{m-1}, b_{m-2}, \ldots b_2, b_1, b_0$ are the binary components of B, and A is an element of $GF(2^m)$, where A satisfies the equation $P(X) = 0$ for $X = A$ and $P(X)$ is a polynomial of degree m which is irreducible over the field $GF(2)$ and has linearly independent roots;
  (b) coupling the outputs of said recirculating shifting storage means to logic circuit means for implementing a predetermined logical function;
  (c) computing a first component of the vector representing the product of said two elements to be multiplied with said logic circuit means;
  (d) shifting the binary components of the vectors representing each of said elements to be multiplied by one position, such that each component replaces the next higher component, and the high order component replaces the low order component;
  (e) applying the shifted binary components to the same logic circuit means and computing a second component of the vector representing the product of the two elements to be multiplied;
  (f) shifting the binary components of the vectors representing each of said elements to be multiplied a second time and applying these components to the same logic circuit means to compute the next component of said product vector; and
  (g) performing the step (f) for $m-1$ times in order that all the m components of the product vector of said two elements to be multiplied may be obtained.

18. A method for multiplying two elements in the finite Galois field $GF(2^m)$ having $2^m$ elements, to obtain a product vector of m binary components, where m is an integer equal to or greater than 2, each of said $2^m$ elements of $GF(2^m)$ represented by a vector of m binary components, the method comprising the steps of:

(a) storing each of said vectors representing said two elements to be multiplied in storage means having m outputs corresponding to each of said vectors, each of said vectors being represented according to a normal basis representation of the form $B = b_{m-1}A^{2^{m-1}} + b_{m-2}A^{2^{m-2}} + \ldots b_2A^4 + b_1A^2 + b_0A$, where B is an element of $GF(2^m)$ and $b_{m-1}, b_{m-2}, \ldots b_2, b_1, b_0$ are the binary components of B, and A is an element of $GF(2^m)$, where A satisfies the equation $P(X) = 0$ for $X = A$ and $P(X)$ is a polynomial of degree on which is irreducible over the field $GF(2)$ and has linearly independent roots;

(b) coupling the m outputs of said storage means for each element to each of m identical logic circuit means for implementing a predetermined logical function, the inputs to each of said successive m identical logic circuit means being successively shifted by one position, such that each component replaces the next higher component and the high order component replaces the low order component; and (c) computing each binary component of the product vector of said two elements such that each of said m identical logic circuit means computes one component of said product vector using said predetermined logical function.

19. The method recited in claims 17 or 18 wherein each of the $2^m$ elements of $GF(2^m)$ is represented by a vector of m binary components according to a normal basis representation of the form $B = b_{m-1}A^{2^{m-1}} + b_{m-2}A^{2^{m-2}} + \ldots b_2A^4 + b_1A^2 + b_0A$, where B is an element of $GF(2^m)$, $b_{m-1}, b_{m-2}, \ldots b_2, b_1, b_0$ are the binary components of B, and A is an element of $GF(2^m)$ satisfying the equation $P(X) = 0$ for $X = A$, where $P(X)$ is a polynomial of degree m which is irreducible over the field $GF(2)$ and has linearly independent roots.

20. A logic circuit which comprises a plurality of interconnected logic elements and which is used in a multiplier to perform multiplication of two elements in the finite Galois field $GF(2^m)$ to obtain a product vector of m binary components, where m is an integer equal to or greater than 2, each of said $2^m$ elements of $GF(2^m)$ represented by a vector of m binary components, made by the steps of:

(a) selecting a polynomial $P(X)$ of degree m which is irreducible in $GF(2)$ and which has linearly independent roots;

(b) defining A as an element of $GF(2^m)$ which satisfies the equation $P(A) = 0$ such that $A, A^2, A^4, \ldots A^{2^{m-1}}$ form a normal basis for $GF(2^m)$;

(c) representing a first element of $GF(2^m)$ to be multiplied in normal basis representation of the form $B = b_{m-1}A^{2^{m-1}} + b_{m-2}A^{2^{m-2}} + \ldots b_2A^4 + b_1A^2 + b_0A$, where B is an element of $GF(2^m)$ and $b_{m-1}, b_{m-2}, \ldots b_2, b_1, b_0$ are the binary components of B;

(d) representing a second element of $GF(2^m)$ to be multiplied in similar normal basis representation of the form $C = c_{m-1}A^{2^{m-1}} + c_{m-2}A^{2^{m-2}} + \ldots c_2A^4 + c_1A^2 + c_0A$, where C is an element of $GF(2^m)$ and $c_{m-1}, c_{m-2}, \ldots c_2, c_1, c_0$ are the binary components of C;

(e) obtaining a product D, in the form of sums of products, of said two elements B and C to be multiplied;

(f) representing said product D in terms of m components $d_i$ for $i = 0, 1, 2 \ldots m-1$, whereby each component $d_i$ is of the form $d_i = f(b_i, b_{i-1}, \ldots, b_0, b_{m-1}, b_{m-2}, \ldots, b_{i+1}, c_i, c_{i-1}, \ldots, c_0, c_{m-1}, c_{m-2}, \ldots, c_{i+1})$ such that each component $d_i$ is formed by rotating the components of B and C by one position for each component $d_i$; and (g) implementing with digital logic elements the logic equation of any one of said components of said product to form said logic circuit whereby each component of said product is computed by said implementation of digital logic elements.

21. The logic circuit recited in claim 20 wherein said interconnected logic elements comprise:

(a) means for performing modulo-two addition; and
(b) means for performing modulo-two multiplication.

22. The logic circuit recited in claim 21 wherein:

(a) said means for performing modulo-two addition comprise modulo-two adders; and
(b) said means for performing modulo-two multiplication comprise AND gates.

23. The logic circuit recited in claim 20 in combination with first and second squaring means having said two elements to be multiplied as respective inputs, each of said squaring means providing as outputs in sequence, its respective element and the m−1 successive squares of said element, said outputs being sequentially fed as inputs to said logic circuit whereby the resulting output from said logic circuit will be the product of said two elements.

24. The combination of claim 23 wherein each of said squaring means comprises an m bit circulating shift register having m outputs and further comprises means for providing clock inputs to said shift registers whereby, after m shifts, each element and the m−1 successive squares of said element at the outputs of said shift registers will be fed as inputs to said logic circuit.

* * * * *

UNITED STATES PATENT AND TRADEMARK OFFICE
CERTIFICATE OF CORRECTION

PATENT NO. : 4,587,627
DATED : May 6, 1986
INVENTOR(S) : JIMMY K. OMURA and JAMES L. MASSEY It is certified that error appears in the above-identified patent and that said Letters Patent is hereby corrected as shown below:

Col. 4, line 38, after "C=" insert --[--.
Col. 5, line 49, change "$A^2=[0,0,1]$ to --$A^2=[0,1,0]$--.
Col. 6, line 37, change "performed" to --performing--.
Col. 6, line 40, change "corresponding" to --corresponds--.
Col. 8, line 33, change "f(xhd1," to --f($x_1$,--
Col. 10, line 28, change "30 $b_{i-1}c_{i-5}+b_{i-5}c_{-1}+b_{i-1}c_{i-1}$--"
 to --+$b_{i-1}c_{i-5}+b_{i-5}c_{i-1}+b_{i-1}c_{i-1}$--.

Signed and Sealed this

Twenty-fifth Day of November, 1986

Attest:

DONALD J. QUIGG

Attesting Officer     Commissioner of Patents and Trademarks